United States Patent [19]

Wardell, Jr.

[11] 4,405,950

[45] Sep. 20, 1983

[54] TELEVISION DISPLAY SYSTEM HANDLING AND ADJUSTMENT APPARATUS

[75] Inventor: Myron H. Wardell, Jr., Lititz, Pa.

[73] Assignee: RCA Corporation, New York, N.Y.

[21] Appl. No.: 264,211

[22] Filed: May 15, 1981

[51] Int. Cl.[3] .......................... H04N 5/64; G01R 31/22; H01J 9/44; H01F 1/00

[52] U.S. Cl. .......................... 358/248; 358/249; 335/212; 445/3; 445/63

[58] Field of Search .......................... 358/10, 139, 248, 249; 335/210, 212; 315/13 C; 29/25.19

[56] References Cited

U.S. PATENT DOCUMENTS

| | | | |
|---|---|---|---|
| 3,654,548 | 4/1972 | Pecorari et al. | 324/20 |
| 3,789,258 | 1/1974 | Barbin | 315/13 CG |
| 3,921,110 | 11/1975 | Ishii et al. | 335/210 |
| 3,992,578 | 11/1976 | Igarashi | 178/7.8 |
| 4,060,836 | 11/1977 | Corbeij et al. | 358/248 |
| 4,163,308 | 8/1979 | Tawa et al. | 316/27 |
| 4,186,414 | 1/1980 | Barinek | 358/248 |
| 4,261,017 | 4/1981 | Branton | 358/248 |
| 4,285,013 | 8/1981 | Brunn et al. | 358/248 |

*Primary Examiner*—Robert L. Richardson
*Attorney, Agent, or Firm*—Paul J. Rasmussen; William H. Meise; Scott J. Stevens

[57] ABSTRACT

A color television display system handling and adjustment apparatus provides a means for maintaining accurate alignment between the base of a kinescope and an energization socket. The kinescope location within the apparatus is referenced to the kinescope front panel contour so that transverse movement of the kinescope does not cause significant movement of the kinescope base. The apparatus also provides means for simulating convergence adjustment of yokes constructed for front and rear tilt convergence adjustment.

4 Claims, 6 Drawing Figures

TELEVISION DISPLAY SYSTEM HANDLING AND ADJUSTMENT APPARATUS

This invention relates to color television display systems and in particular to a method and apparatus for aligning and adjusting a kinescope and associated deflection yoke within a display system fixture.

Color television receivers incorporate a picture tube or kinescope having an electron gun apparatus for producing three electron beams which impinge on and excite phosphor elements which are deposited on a display screen. The three electron beams are deflected or scanned across the screen by magnetic fields generated by a deflection yoke to form a raster, or area excited by the electron beams.

Each electron beam is caused to excite only one particular color-producing phosphor type by the operation of a shadow or aperture mask or grid placed close to the kinescope front panel. Since the three electron beams originate from different locations within the electron gun assembly, they will pass through the aperture masks at different angles, and impinge on different display screen areas. The extent to which each of the respective beams excite only one phosphor type determines the color purity of the scanned raster. Color purity is optimized by longitudinal or Z-axis adjustment of the deflection yoke on the kinescope neck.

It is important that the phosphor areas excited by each of the three beams lie close to one another at all locations on the display screen; that is, the beams should converge. Good convergence is necessary to prevent color fringing and improper color rendition at normal viewing distances. Some television receivers provide dynamic beam convergence through electronic circuitry which modifies the shape of the deflection yoke input waveform. With the development of in-line electron beam kinescopes, it is possible to construct a deflection yoke which can substantially converge the three electron beams at all locations on the kinescope display screen without the need for dynamic convergence circuitry. These "self-converging" yokes achieve the previously described beam convergence through the use of deflection coils wound to provide non-uniform deflection fields. The results of a mathematical analysis using third order aberration theory may be interpreted to show that a self-converging vertical deflection field should have a net overall barrel-shaped distribution transverse to the longitudinal yoke axis, while a self-converging horizontal deflection field should have a net overall pincushion-shaped distribution. It is also known that localized modifications of these fields may improve conditions such as vertical coma error and side pincushion distortion, but the net overall distribution must remain as described to maintain beam convergence.

It can be appreciated that with the presence of nonuniform deflection fields, the transverse position of the yoke with respect to the kinescope neck (and hence the electron beams) is extremely critical in order to achieve good beam convergence. In some applications, the deflection yoke is placed on the tube and adjusted during final receiver assembly. These adjustments are often done by hand. Since it is difficult to accurately position and adjust the yoke transversely on the neck by hand with the desired X- and Y- axis movement, an adjustment compromise may be made. The yoke may be secured to the kinescope neck at either its front or rear (depending on the application), thereby forming a pivot point at that location. The remote end of the yoke is then transversely adjusted on the kinescope neck until beam convergence is optimized. It has been found that tilting the yoke for adjustment simulates actual X-Y transverse yoke movement sufficiently to provide accurate adjustment capabilities.

Yokes may also be mated to kinescopes outside the receiver to form a yoke-tube combination. The yoke may be positioned and adjusted on the kinescope by a yoke adjustment machine, which may adjust the yoke using the previously described methods of actual X-Y translation. The preadjusted yoke-tube combination may be used during final receiver assembly.

The quality of beam convergence that is realizable from a tube-yoke combination also depends on the quality of the kinescope. The accuracy of position of the electron gun assembly and the aperture mask or grid contribute to the optimum beam convergence condition. It is therefore important that each kinescope be tested to determine whether it meets the specifications necessary to permit acceptable beam convergence in the final receiver assembly. The kinescopes are normally tested on a test cart or apparatus with a standard yoke having average performance specifications, whereas the yoke adjustment machine operates on production yokes and kinescopes. The kinescope test apparatus and yoke adjustment machines may also simulate the receiver environment electrically and magnetically to aid in tube evaluation and yoke adjustment. It is desirable, for efficiency purposes, that as many adjustment steps be performed via remote operation motors and drive mechanisms as is possible, so that the equipment operator may directly view the kinescope display screen while adjusting the yoke. In a typical test apparatus or yoke adjustment machine, the tube is loaded into position, with the yoke with which the tube is to be mated or tested and tube energizing socket brought into position by a mechanical driven mechanism. One problem encountered with this arrangement is that variations in tube dimensions may cause difficulty in mating the energizing socket to the tube base, resulting in cracked or otherwise damaged tubes. It is desirable to provide a kinescope handling fixture with wide tolerances for variations in tube dimensions while still maintaining safe and accurate socket mating. It is also desirable to provide a kinescope test apparatus that will permit accurate beam convergence measurements using either of the previously described front or rear tilt yoke adjustment techniques.

The present invention is directed to a kinescope handling apparatus or fixture in which movement of the kinescope front panel within the fixture does not cause a substantial movement of the tube base, thereby allowing accurate socket mating. When used in an arrangement for testing kinescopes, the apparatus also accurately simulates either X-Y, front tilt or rear tilt yoke adjustment to provide accurate beam convergence measurement information.

In the accompanying drawing.

Figure 1:
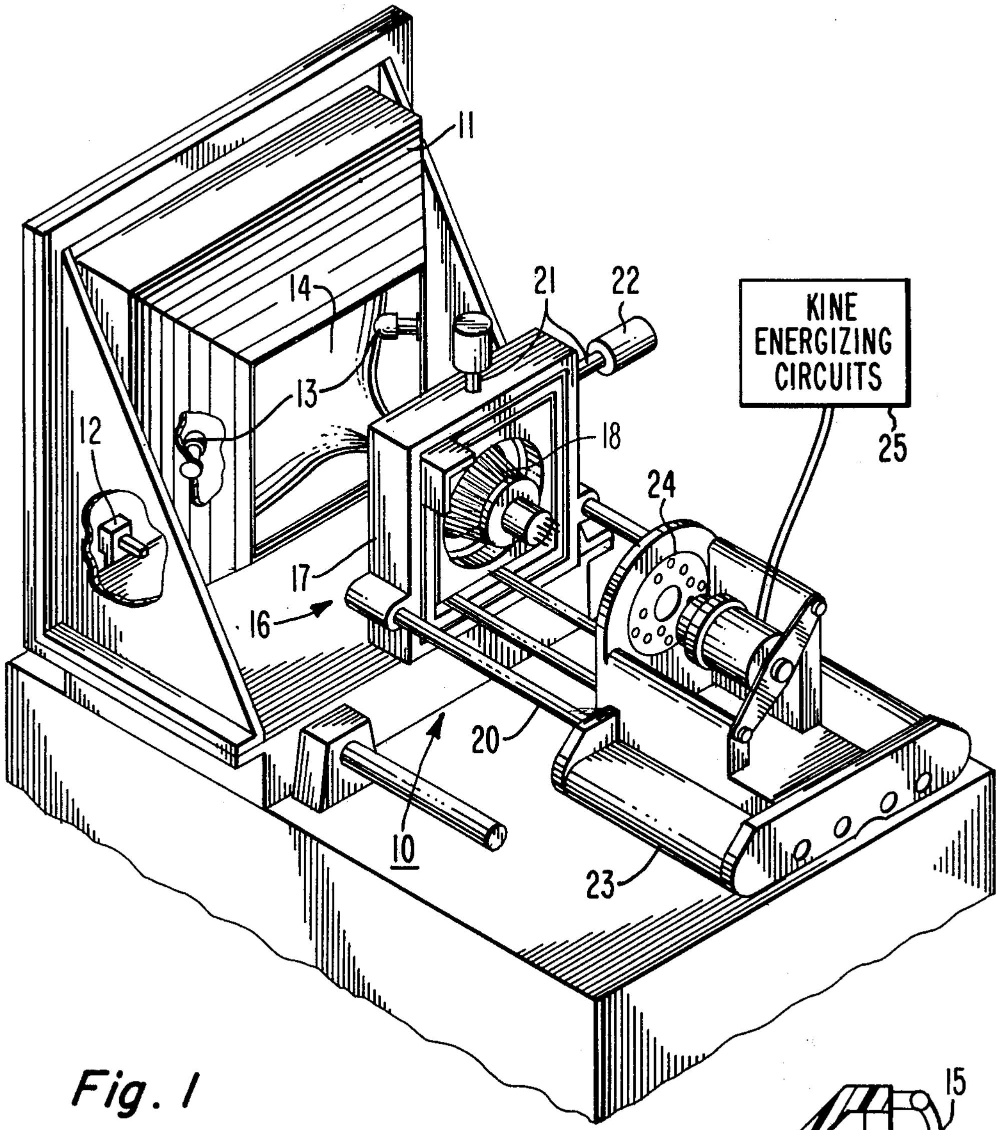
FIG. 1 is a perspective view of a television display system handling and adjustment apparatus in accordance with the present invention.
Figure 3A:
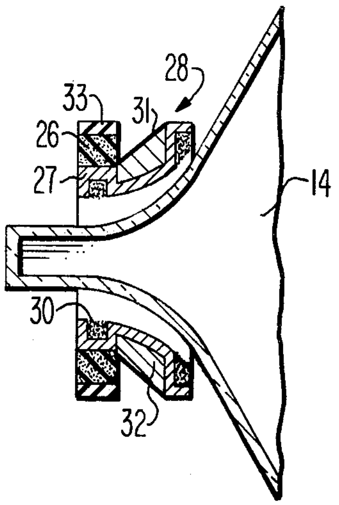
Figure 3B:
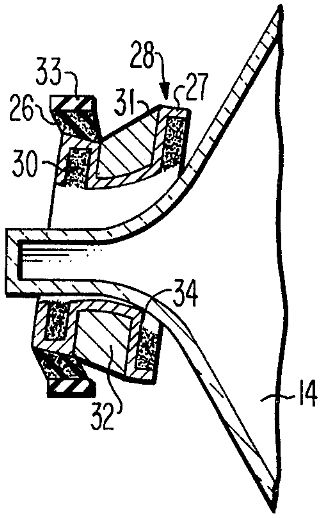
Figure 4A:
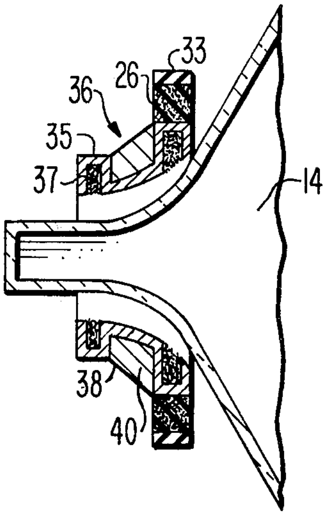
Figure 4B:
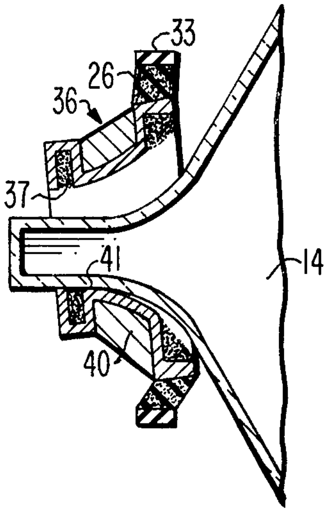

FIGS. 3*a* and 3*b* are side cross-sectional views of a portion of the test apparatus of FIG. 1 illustrating its operation during adjustment of a front tilt yoke; and FIGS. 4*a* and 4*b* are cross-sectional views of a portion of the test apparatus of FIG. 1 illustrating its operation during adjustment of a rear tilt yoke.

Figure 2:
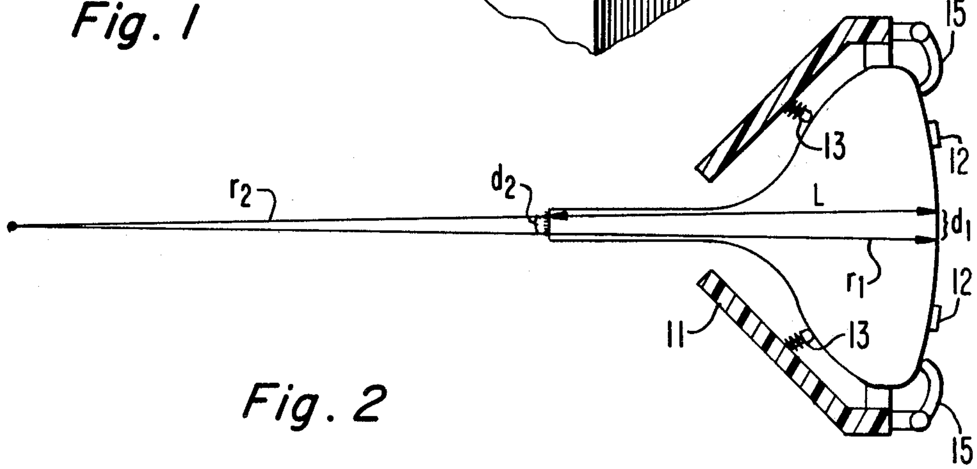
FIG. 2 is a top cross-sectional view of a portion of the test apparatus shown in FIG. 1, illustrating tube positioning apparatus.

Referring to FIG. 1, there is shown a color television display system handling and adjustment apparatus 10 which may be incorporated, for example, as a part of a kinescope test device or as part of a yoke adjustment machine which provides complete tube-yoke combinations. The handling and adjustment apparatus 10 comprises a kinescope holding fixture 11 which incorporates support feet 12 and biasing members 13. FIG. 1 is shown broken away to illustrate the position of support feet 12. Support feet 12 are also shown in FIG. 2. A kinescope 14 is shown in place within fixture 11. Support feet 12 have contoured surfaces which contact the bottom and front of the kinescope front panel. Additional support posts 15 (also shown in FIG. 2) contact the front panel of the kinescope. Biasing members 13 contact the rear of the kinescope, thereby maintaining the kinescope front panel in contact with support feet 12 and support posts 15. The operation of these components will be described later.

Handling and adjustment apparatus 10 also comprises a yoke adjustment apparatus 16 which incorporates a yoke holder 17. A yoke 18 is shown in place within yoke holder 17. Apparatus 16 is mounted on rails 20 which permit movement or adjustment of yoke 18 in a direction parallel to the longitudinal kinescope axis (Z-axis). A driving mechanism or motor (not shown) moves apparatus 16 along rails 20. Yoke holder 17 is mounted to apparatus 16 via adjustment rods or members 21 which when driven, for example, by a motor 22, cause yoke holder 17 to be moved transversely along the yoke (X and Y axis) with respect to the kinescope longitudinal axis. Rotation ($\theta$) about the tube Z-axis may also be provided. The previously described X, Y and Z-axis movement and $\theta$ rotation allow the yoke to be accurately adjusted on the neck of a kinescope for optimum beam convergence. The manner in which these adjustments are made is described below.

Apparatus 16 also comprises a kinescope energization apparatus 23 which incorporates an energization socket 24. Socket 24 fits onto the base of kinescope 14 and provides the necessary voltages and signals in order to operate kinescope 14. Socket 24 is electrically coupled to kinescope energization circuits 25 which provide the appropriate signals to socket 24. Apparatus 23 is also mounted on rails 20 to allow socket 24 to be placed on or removed from kinescope 14.

Although apparatus 23 and socket 24 are moveable in a direction parallel to the longitudinal axis of kinescope 14 along rails 20, no transverse adjustment of socket 24 is provided. It is therefore important that a particular X-Y location of the tube base be maintained from tube to tube to allow accurate mating between the kinescope and socket 24 in order to prevent damage to the kinescope or socket. Some previous kinescope test apparatus referenced the location of the kinescope within the holding fixture to the outside of the tube, close to the yoke assembly. Dimensional variations in tube size or the presence or absence of protection bands on the tube could cause the X-Y location of the tube reference point to change, thereby causing the X-Y location of the tube base to change by a corresponding amount, often requiring time consuming and inefficient manual adjustment of the energization socket location to provide a proper tube-socket connection.

FIG. 2 illustrates the manner in which the apparatus of the present invention substantially reduces the previously described tube mislocation problem. As mentioned, a portion of support feet 12 and support posts 15 contact the front panel of kinescope 14. The front panel has a contour which is essentially spherical, with a radius $r_1$. The kinescope has an overall length of L, which is much less than $r_1$. The difference between $r_1$ and L, the distance from the origin of $r_1$ to the tube base, is defined and shown in FIG. 2 as $r_2$. Spring loaded biasing members 13 maintain feet 12 and posts 15 in contact with the front panel of kinescopes 14. If tube variations or other factors cause the tube to move in an X or Y direction with respect to an optimium location, for example, by a distance $d_1$, the contact points of feet 12 and posts 15 will move along the spherical contour of the kinescope front panel by a corresponding amount. By maintaining contact between the kinescope front panel and feet 12 and posts 15, the tube will not experience a corresponding X or Y axis offset, but will rather trace an arc having a radius of $r_1$. The rear or base of kinescope 14 will also trace an arc or equal angle, but its arc will have a radius of $r_2$. The X or Y location shift ($d_2$) of the tube base will be equal to $d_1$ times the ratio or $r_2$ to $r_1$, or $$d_2 = d_1(r_2/r_1, \text{ where } r_2 = r_1 - L$$

For a representative 25V110° kinescope, $r_1=43$ inches, $L=18$ inches and $r_2=25$ inches. Therefore, $d_2=0.58d_1$, which indicates that any movement of the kinescope within fixture 11 will result in a much smaller movement of the tube base, allowing accurate mating with energizing socket 24 even with variations in tube dimensions. By referencing the kinescope location within fixture 11 to the contour of the front panel, tube and socket mating problems encountered in some prior art arrangements are significantly reduced. Since the socket 24 moves parallel to the tube longitudinal axis, tube length variations do not present a problem in placing the socket 24 onto position on the tube base.

It is possible to utilize yoke adjustment apparatus 16 to accurately adjust yokes having different mounting and adjustment arrangements on kinescope 14. For example, it is possible to adjust a yoke via proper operation of adjustment rods 21 by moving the entire yoke along its X, Y and Z axis and rotating the yoke about the yoke longitudinal axis. The previously described "pure X-Y" yoke translation is necessary to achieve proper beam convergence in some applications.

Adjustment of yokes embodying the previously described front and rear tilt mounting and adjustment arrangements in a kinescope test apparatus will now be described with reference to FIGS. 3 and 4. With a front tilt mounting and adjustment arrangement, the front of the yoke is secured to the kinescope, for example, through resilient pads. The rear of the yoke is then moved transversely with respect to the kinescope neck until proper beam convergence is achieved, with the result that the entire yoke is tilted or pivoted about a point in front of the yoke. Yoke holder 17 incorporates a flexible member, such as a rubber ring 26, which is mounted to the rear of the yoke. FIGS. 3*a* and 3*b* illustrate the ring 26 mounted to a portion of an insulator 27 of a yoke 28. Also shown are saddle-type horizontal deflection coils 30, vertical deflection coils 31 toroidally wound about a magnetically permeable core 32, and a frame 33 of yoke adjustment apparatus 17. Adjustment of the front tilt yoke of FIGS. 3*a* and 3*b* comprises the steps of initially moving the yoke with X and Y-axis translation from a beam misconvergence condition. Although in actual receiver assembly the yoke is tilted throughout its entire adjustment, the use of actual X and Y-axis translation closely approximates the tilt adjustment to permit reliance on kinescope test measurements obtained by this technique. The yoke shown in FIGS. 3*a* and 3*b* is constructed so that during X-Y translation, the front of the yoke will come in contact with the kinescope before the rear. If optimum beam convergence is not achieved before the front of yoke 28 contacts the kinescope 14 at a point 34, the yoke will pivot about the contact point 34, as shown in FIG. 3*b*, thereby simulating the actual yoke tilt adjustment. Frame 33 remains in alignment with respect to the kinescope neck, as shown also in FIG. 3*b*, while rubber ring 26 distorts to allow yoke 28 to tilt. Rubber ring 26 also absorbs the adjustment force and prevents tube damage in the event beam convergence has not been achieved before the rear of yoke 28 also contacts kinescope 14. Force limiting means may also be incorporated into rods 21 or motor 22 is desired. It is obvious that only X-Y yoke translation may be necessary to converge a kinescope from a first misconverged condition while further yoke movement necessitating yoke tilting may be necessary to converge a kinescope from a second misconverged condition in which the second misconverged condition exhibits a greater amount of misconvergence than that exhibited by the first misconverged condition.

FIGS. 4*a* and 4*b* illustrate the adjustment arrangement for a rear tilt yoke. The rear tilt yoke is normally mounted to the kinescope in such a manner that the rear of the yoke is relatively fixed with respect to the kinescope while the front of the yoke is moveable. The front of the yoke is then moved transversely until proper beam convergence is achieved, resulting in a tilt of the entire yoke. Rubber ring 26 is mounted to an insulator 35 of a yoke 36 at the front of the yoke. Also shown are saddle-type horizontal deflection coils 37, vertical deflection coils 38 toroidally wound about a core 40, and frame 33 of apparatus 17. Yoke 36 is adjusted by initially moving the yoke with actual X and Y-axis translation. As described with respect to the front tilt yoke, this X-Y motion closely approximates the actual tilting adjustment of the yoke sufficiently to rely upon the test measurements obtained. Yoke 36 is constructed to contact the kinescope 14 at the rear of the yoke before the front. In the event X-Y movement does not achieve beam convergence before the yoke contacts the kinescope, the yoke will pivot about a contact point 41, as shown in FIG. 4*b*, thereby simulating the actual tilting adjustment of the yoke 36. As previously described, rubber ring 26 distorts to allow yoke 36 to tilt and also absorbs motor 22 driving force in order to prevent kinescope damage in the event the front of the yoke also contacts the kinescope before beam convergence is achieved. It is also obvious that the original misconvergence condition exhibits a greater beam misconvergence than when convergence is achievable by only X-Y-axis translation. If the adjusted yoke is to be mated with the kinescope, for example in a yoke adjustment machine, the yoke may be mounted to the kinescope, for example in a yoke adjustment machine, the yoke may be mounted to the kinescope via glue or other mounting means and removed from frame 17. If the kinescope is being tested, the yoke and frame assembly is moved away from the kinescope rods 20.

The yoke adjustment apparatus of the present invention may be used to test kinescopes of television display systems having tilt-type yokes (either front or rear tilt) by adjusting the tilt-type yoke with only X-Y axis movement. Actual tilting of the yoke may be unnecessary to collect accurate information regarding kinescope quality.

What is claimed is:

1. An apparatus for positioning a deflection yoke on the neck of a color television kinescope to converge a plurality of electron beams on the face of said kinescope, comprising:

a yoke holder coupled to one end of said yoke, said yoke holder comprising a rigid member and a flexible member disposed between said rigid member and said yoke; and means for moving said yoke holder in a direction transverse with respect to said kinescope neck through a first distance in which both ends of said yoke are free to move with respect to said kinescope neck and in the same transverse direction through a second distance such that the end of said yoke remote from said yoke holder contacts said kinescope at a contact point, causing said yoke to pivot about said contact point, movement of said yoke through said first and second distances converging said beams from a first and second misconverged condition, respectively, said pivoting of said yoke causing the shape of said yoke holder flexible member to distort in order to maintain said yoke holder rigid member in orthogonal alignment with respect to said kinescope neck.

2. The arrangement defined in claim 1, wherein said yoke moving means moves said yoke along the horizontal and vertical axis of said kinescope.

3. The arrangement defined in claim 1, wherein said yoke holder flexible member comprises an elastic ring encircling one end of said yoke.

4. A method for positioning a deflection yoke on the neck of a color television kinescope to converge a plurality of electron beams on the face of said kinescope, comprising the steps of:

coupling one end of said yoke to a yoke holder comprising a rigid member and a flexible member disposed between said rigid member and said yoke;

moving said yoke holder in a direction transverse with respect to said kinescope neck in which both ends of said yoke are free to move with respect to said kinescope neck in order to converge said beams from a first misconverged condition; and moving said yoke holder in the same transverse direction through a sufficient distance such that the end of said yoke remove from said yoke holder contacts said kinescope at a contact point, causing said yoke to pivot about said contact point, in order to converge said beams from a second misconverged condition, said pivoting of said yoke causing the shape of said yoke holder flexible member to distort in order to maintain said yoke holder rigid member in orthogonal alignment with respect to said kinescope neck.

* * * * *